United States Patent [19]
Hirsh et al.

[11] Patent Number: 6,043,001
[45] Date of Patent: Mar. 28, 2000

[54] DUAL MASK PATTERN TRANSFER TECHNIQUES FOR FABRICATION OF LENSLET ARRAYS

[75] Inventors: Jeffrey I. Hirsh; Joseph F. Revelli; Joseph Jech, all of Rochester, N.Y.

[73] Assignee: Eastman Kodak Company, Rochester, N.Y.

[21] Appl. No.: 09/026,990

[22] Filed: Feb. 20, 1998

[51] Int. Cl.[7] .................................................. G03F 7/00
[52] U.S. Cl. ......................... 430/321; 430/323; 430/324; 430/330; 216/26
[58] Field of Search ................................... 430/321, 323, 430/324, 330; 216/26

[56] References Cited

U.S. PATENT DOCUMENTS

| 4,689,291 | 8/1987 | Popovic et al. . |
| 5,605,783 | 2/1997 | Revelli et al. . |
| 5,723,264 | 3/1998 | Robello ................................... 430/321 |

FOREIGN PATENT DOCUMENTS

| 60-263458 | 12/1985 | Japan . |
| 3-21901 | 1/1991 | Japan . |
| 4-226073 | 8/1992 | Japan . |

OTHER PUBLICATIONS

Ishihara et al, A High Photosensitivity IL–CCD Image Sensor with Monolithic Resin Lens Array, International Electron Devices Meeting, 1983, pp. 497–500.
Moran et al, High Resolution Profile Resist Patterns, J. Va. Sci. Technol. 16(6), Nov./Dec. 1979, 1620–1624.

Primary Examiner—Sharon Gibson
Assistant Examiner—Nicole Barreca
Attorney, Agent, or Firm—Raymond L. Owens

[57] ABSTRACT

A method for forming lenslets of a solid-state imager, includes providing a first etch-stop layer on a spacer layer formed on a substrate or layer(s) on a substrate; providing a patterned first photosensitive resin layer to form a first mask pattern; performing an etch transfer of the first mask pattern to the first photosensitive resin layer to form a first etch-stop mask pattern, and removing the first photosensitive resin layer; providing a transparent lenslet-forming layer on the spacer layer. The method further includes forming a second etch-stop layer on the transparent lenslet-forming layer to form a second mask pattern and patterning a second photosensitive resin layer on the second etch-stop layer wherein the second mask pattern corresponds to the lenslet array to be formed and wherein the lenslet array defined by the second mask pattern is aligned to the array of open regions of the first etch-stop mask pattern; transferring by etching the pattern of the second photosensitive resin layer to the second etch-stop layer to form a second etch-stop mask pattern; anisotropically plasma etching the transparent lenslet-forming layer according to the second etch-stop mask pattern; anisotropically plasma etching the spacer layer according to the first etch-stop mask pattern; isotropically etching to remove remaining portions of the first etch-stop layer forming the first etch-stop mask and portions of the second etch-stop layer forming the second etch-stop mask; and thermally reflowing the patterned transparent lenslet-forming layer to form the lenslets on the solid-state imager.

6 Claims, 4 Drawing Sheets

DUAL MASK PATTERN TRANSFER TECHNIQUES FOR FABRICATION OF LENSLET ARRAYS

FIELD OF THE INVENTION

The present invention relates to methods of forming lenslet arrays, which are suitable for solid state imagers.

BACKGROUND OF THE INVENTION

Solid state imaging devices typically include two principal parts; an image-forming part (i.e., a lens) and an image-capture part (i.e., a solid-state imager). The lens projects the image onto the surface of the solid-state imager at which surface the image is divided uniformly into many small picture elements or "pixels". These pixels are quite small and typically range in size from less than ten microns to over 100 microns across. The solid-state imager itself is typically a silicon chip upon which an array of photodiodes has been fabricated such that each pixel is associated with a single photodiode element.

A subset of solid-state imagers is known as "interline" devices. In these devices the area of the photodiode is significantly less than that of the pixel. A lightshield is placed over the pixel area except in the photodiode region to prevent light from entering other light-sensitive device elements such as the transfer gate or the shift register which are within the pixel area but outside the photodiode. Consequently, any light that falls on a particular pixel outside the photodetector area can not be captured unless some sort of optical condensing element such as a lenslet is positioned between the light source and the photodetector. The desired characteristics of arrays of such lenslets are 1) the lenslets must be properly aligned with respect to the photodiode array; 2) the lenslets must be properly spaced from the photodiode, or, alternatively, the index of refraction and the radius of curvature must be such that the resulting focal length of the lenslet is approximately equal to the distance between the lenslets and the photodiodes; 3) the lenslets must be optically transparent and remain so in ambient conditions; 4) the lenslets must be as closely spaced as possible to minimize non-captured light; 5) the lenslets must be as uniform as possible; and 6) the lenslets must be mechanically and chemically robust.

Integrated microlens structures and fabrication processes are known in the art. See, for example, Y. Ishihara et al., "A High Photosensitivity IL-CCD Image Sensor with Monolithic Resin Lens Array," International Electron Devices Meeting, 1983, pp. 497–500, for cylindrical lenslet arrays and Popovic et al., U.S. Pat. No. 4,689,291, for spherical lenslet arrays.

For a specific example, see commonly assigned U.S. Pat. No. 5,605,783 whose process steps are summarized in FIGS. 1A and 1B. The organic spacer layer 14 itself is deposited directly on the surface of the solid-state image sensor. It will be understood that a planarization layer and/or organic spacer layer 24 could be deposited on top of other layers that have been deposited on the surface of the solid state sensor. These additional layers could include color filter arrays (such as might be found in color solid state imaging devices), light shield layers, or other planarization layers. A photosensitive resin is then deposited over these organic layers and photolithographically patterned into lenslet precursor structures 12 (FIG. 1A), and then sufficiently heated to cause them to reflow, thereby forming semi-cylindrical or semi-spherical lenslets 16 (FIG. 1B). There are several problems with this way of forming lenslet arrays. First of all, especially for color solid-state imagers, typical photosensitive resins contain components that absorb light in the blue region of the visible spectrum. This results in a distortion of the color spectrum or "yellowing" of the scene that is recorded by the photodetector array. Moreover, the color distortion increases with time due to oxidation of the resin. A second difficulty with this method of forming lenslet arrays is that the resolution with which the photosensitive resin can be patterned is limited by the thickness of the resin layer. A thicker resin layer generates a lenslet pattern with larger spaces between lenslets and, consequently, the less the light collection efficiency of the array. On the other hand, the resin layer must be thick enough so that, when reflowed, the curvature of the resultant lenslets is sufficient to cause the desired focusing effect. Accordingly, it is not possible to obtain the optimum collection efficiency with lenslet arrays fabricated in this manner.

The photosensitive resin serves as both the patterning means and the lens-forming means in the aforementioned prior art lenslet fabrication methods. Alternative techniques have been proposed which avoid some of the difficulties mentioned above. In these techniques the photolithographic patterning and lens-forming functions are separated by means of a process known as pattern transfer.

FIGS. 2A–D illustrate a pattern transfer scheme disclosed by Y. Hokari in Japanese Kokai Patent Application No. Hei 4[1992]-226073. In the figure, an inorganic transparent lenslet-forming layer 18, made of a transparent inorganic material such as silicon dioxide, is deposited on the surface of an organic spacer layer 14 which is deposited on the surface of the solid-state imager chip. A thick photosensitive resin layer (not shown) is then deposited on inorganic transparent lenslet-forming layer 18 and patterned to form lenslet precursor structures 12 (FIG. 2A). The lenslet precursor structures 12 are subsequently transformed into lenslets 16 by thermally reflowing (FIG. 2B). As shown in FIG. 2C, inorganic transparent lenslets 20 are then created by transferal of the lens-shaped pattern formed by the reflowed resin to the inorganic transparent lenslet-forming layer 18 by reactive ion etching. Next, $SiO_2$ is deposited selectively only on the surfaces of the inorganic transparent lenslets 20 by means of well-known "spin-on-glass" or SOG techniques to form inorganic lenslet covering films 22 which is shown in FIG. 2D. In this fashion, the spacing between the lenslets 16 can be effectively reduced to zero thereby increasing the light capturing efficiency of the lenslets 16. One difficulty with this method is the formation of thick layers (i.e. 10 microns) of inorganic materials such as $SiO_2$ especially on organic bases. Deposition techniques such as RF (radio frequency) sputtering require several hours of deposition time to form such thick layers. During such lengthy deposition times the organic base can become hot enough to decompose. Furthermore, thick layers of inorganic materials tend to be mechanically unstable and crack or peel, especially when deposited on organic bases. In addition, films of SOG can require treatment at temperatures as high as 400° C. in order to become fully densified. Clearly the high temperatures associated with thick film inorganic layer deposition are incompatible with both the solid-state imager substrate and the organic layers. Furthermore it is extremely difficult to control the reactive ion etch conditions in order to transfer the lens pattern in the organic resin faithfully to the inorganic layer. Exact etch conditions must be found for which the etch rates of the organic and inorganic materials are identical. Deviations from these conditions or non-uniformity of the etch conditions will result in the formation of unacceptable lonslet arrays. Reactive ion etching can also result in unacceptably rough lenslet surface finishes. Finally, it is unlikely that the inorganic lenslet covering film 22 on top of the inorganic transparent lenslets 20 would be conformal as indicated in FIG. 2D. This means that the shape of the lenslets 16 would not be preserved after application of the spin on glass especially in the region between the inorganic transparent lenslets 20. Therefore it is unlikely that the light collection efficiency of the spin on glass-coated inorganic transparent lenslets 20 would be any more than that of uncoated lenslets.

Another alternative scheme for lenslet fabrication that involves pattern transfer is described by H. Kawashima et al. in Japanese Kokai Patent Application No. Hei 3[1991]-297167. Referring to FIGS. 3A–E, a thick (i.e., several microns) transparent inorganic planarization/spacer layer 24 is deposited on the surface of the solid-state imager chip. An organic transparent lenslet-forming layer 26 is then deposited on the inorganic planarization/spacer layer 24. This organic transparent lenslet-forming layer 26 is made of a transparent thermoplastic resin such as PMMA (polymethylmethacrylate), PGMA (polyglycidylmethacrylate), PMIPK (polymethylisopropenylketone), etc. Next a first photosensitive resin layer 28 is deposited on the organic transparent lenslet-forming layer 26 as shown in FIG. 3A. After photolithographically patterning the first photosensitive resin layer 28, the pattern is transferred to the organic transparent lenslet-forming layer 26 by way of oxygen plasma etching (FIG. 3B). The inorganic planarization/spacer layer 24 behaves as an etch-stop for the oxygen plasma etch process. The first photosensitive resin etch-mask 30 is removed with a release solution (ethanol, acetone, etc.) leaving organic lonslet precursor 32 in the thermoplastic resin. The transparent microlens array is then created by thermally reflowing the organic lenslet precursor 32 to form organic transparent lenslet 34 which are shown in FIG. 3C. The disclosure goes on to describe the application and patterning of a second photosensitive resin etch-mask 36 which is shown in FIG. 3D. A wet etch solvent is used to remove unwanted portions of the inorganic spacer pad 38 and the residual resist is removed with a solvent such as ethanol as shown in FIG. 3E. Patterning of the inorganic planarization/spacer layer 24 is necessary in order to provide access to electrical contacts of individual solid-state imagers. Several of these imagers are fabricated on a single silicon wafer which is subsequently diced into separate devices. If the inorganic planarization/spacer layer 24 is patterned prior to spin-coating the organic transparent lenslet-forming layer 26, nonuniform coating of the organic transparent lenslet-forming layer 26 results. This in turn causes nonuniformity of the lenslet array. The fabrication sequence described in FIGS. 3A–E is designed to avoid this problem.

As mentioned with respect to the previously cited reference of Hokari, the deposition of thick inorganic layers is usually problematical due to the long deposition times or high processing temperatures or both. The Kawashima reference also suffers from the fact that most organic photosensitive resins are not immune to erosion by oxygen plasma etching. This lack of selectivity implies that the resin mask will erode as the thick thermoplastic resin layer is being etched and will result in poorly formed lenslet precursor structures and consequently poorly formed semi-spherical lenslets. Even if the selectivity of the photosensitive resin were to be sufficient to withstand exposure to the lengthy oxygen plasma etch process, the difficulty of removing the residual resist prior to reflowing the thermoplastic resin and after patterning the inorganic spacer layer is problematical. Solvents that are used to remove the photoresists (e.g., ethanol, acetone) can also dissolve the organic thermoplastic resin.

Other prior art references to pattern transfer methods for fabricating lenslet arrays that avoid the use of photosensitive resin as the etch-stop mask include Japanese Kokai Patent Applications No. Hei 3[1991]-21901 disclosed by S. Uchiyama and No. Sho 60[1985]-263458 disclosed by M. Tatewaki. Both of these Kokai patent applications describe schemes wherein a thermoplastic resin layer is deposited on the spacer layer followed by application of a thin inorganic layer on top of the thermoplastic resin layer. A photosensitive resin is applied to the thin inorganic layer and patterned according to the lenslet array pattern. The photosensitive resin pattern is transferred to the thin inorganic layer by means of wet etching. The resultant patterned inorganic layer serves as an etch-stop mask for oxygen plasma etching the thermoplastic layer. The thin inorganic etch-stop mask is then removed by wet etching and the patterned thermoplastic layer is melted to form the lenslet array.

Although the methods described in the Kokai patent applications by Uchiyama and Tatewaki address problems associated with using the photosensitive resin as the lenslet material or as the etch-stop mask in a pattern transfer process, they fail to address the problem of lenslet uniformity. As mentioned in previously referenced Japanese Kokai Patent Application No. Hei 3[1991]-297167, it is difficult to obtain uniform coating of the lenslet-forming layer and ultimately in the lenslet array if the spacer layer is patterned prior to spin-coating the lenslet-forming layer.

SUMMARY OF THE INVENTION

It is therefore an object of the present invention to provide lenslet arrays that are particularly suitable for image sensors that eliminate the above noted difficulties.

This object is achieved by a method for forming lenslets which collect light and focuses the light onto photosensitive elements of a solid-state imager, comprising the steps of:

(a) providing a first etch-stop layer on a spacer layer formed on a substrate or layer(s) on a substrate;

(b) providing a first photosensitive resin layer on the first etch-stop layer and patterning the first photosensitive resin layer to form a first mask pattern wherein the first mask pattern defines an array of open regions corresponding to the lenslet array to be formed such that the area of each open region is less than or equal to the area of the footprint of the corresponding lenslet and wherein the first mask pattern also defines the areas of the spacer layer which are to be removed;

(c) performing an etch transfer of the first mask pattern of the first photosensitive resin layer to the first etch-stop layer to form a first etch-stop mask pattern in the first etch-stop layer, and removing the first photosensitive resin layer;

(d) providing a transparent lenslet-forming layer over the spacer layer;

(e) forming a second etch-stop layer on the transparent lenslet-forming layer and patterning a second photosensitive resin layer on the second etch-stop layer to form a second photosensitive resin mask pattern wherein the second photosensitive resin mask pattern corresponds to the lenslet array to be formed and wherein the lenslet array defined by the second mask photosensitive resin pattern is aligned to the array of open regions of the first etch-stop layer;

(f) transferring by etching the pattern of the second photosensitive resin layer to the second etch-stop layer to form a second etch-stop mask pattern;

(g) anisotropically plasma etching the transparent lenslet-forming layer according to the second etch-stop mask pattern to form a transparent lenslet precursor;

(h) anisotropically plasma etching the spacer layer according to the first etch-stop mask pattern;

(i) isotropically etching to remove remaining portions of the first etch-stop layer forming the first etch-stop mask and portions of the second etch-stop layer forming the second etch-stop mask; and (j) thermally reflowing the patterned transparent lenslet precursor to form the lenslets on the solid-state imager.

DETAILED DESCRIPTION OF THE PREFERRED EMBODIMENTS

In the present invention, use is made of the trilayer processing technique to avoid many of the difficulties associated with prior art. The processing steps of the trilayer RIE-PCM system include coating a thick organic spacer layer, plasma CVD (chemical vapor deposition) RF sputter-coating or otherwise depositing a thin layer of inorganic material such as $SiO_2$, coating a photosensitive resin layer, exposing through the appropriate mask, developing the pattern, etching the exposed inorganic material, and transferring the pattern to the organic layer by means of oxygen plasma RIE. By use of the term "thin inorganic etch stop" in this specification is meant that the inorganic etch stop layer has a thickness of less than 100 nm but preferably less than 50 nm. The advantage of this process is that only a thin layer of photosensitive resin is required to pattern the thin inorganic layer. The term "thin photosensitive resin layer" means a photosensitive resin layer having a thickness of 300 to 800 nm The thin inorganic layer in turn acts as an etch-stop or etch-mask for the oxygen plasma RIE and the anisotropic nature of the etch results in nearly vertical walls in the thick organic spacer layer. Throughout this specification and claims the term "spacer layer" will be understood to mean one or more layers which are formed over a substrate. Spacer layers can include one or more planarization layers or other layers which provide spacing between lenslets and the substrate. The spacer layers can be either formed from organic or inorganic materials. The term "spacer pad" refers to one or more spacer layers which have been patterned as part of the process of forming a lenslet which collect and focus light onto photosensitive elements or the like.

Figure 1A:
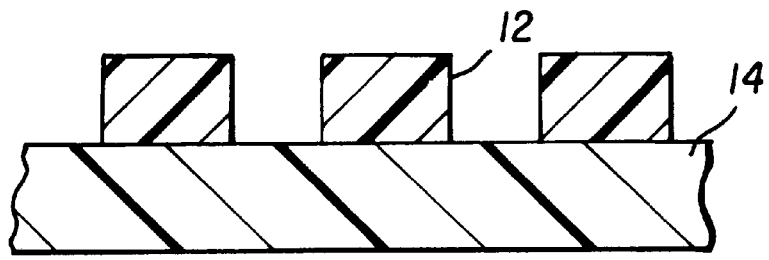
FIGS. 1A and 1B show various steps in a conventional process for forming lenslets.
Figure 1B:
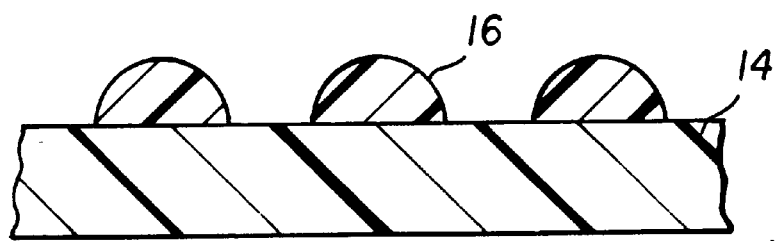
Figure 2A:
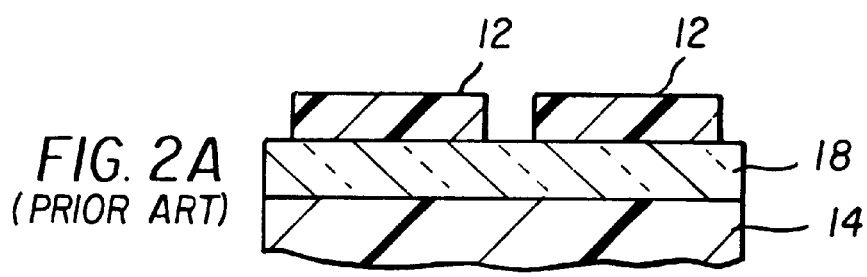
FIGS. 2A–D show a series of steps in another conventional process for forming lenslets.
Figure 2B:
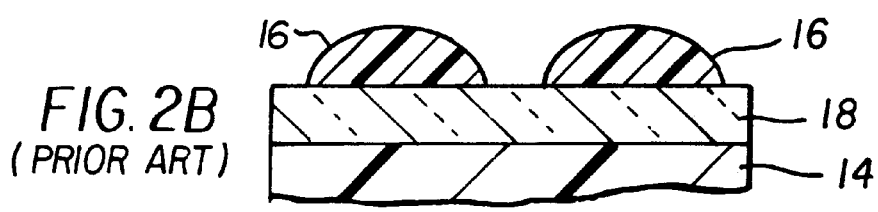
Figure 2C:
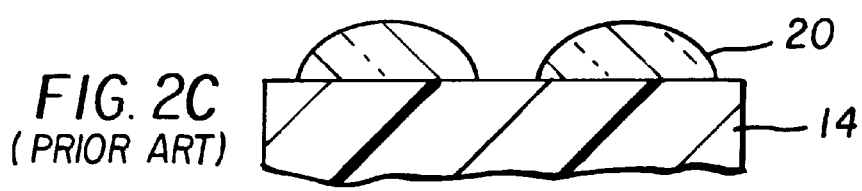
Figure 2D:
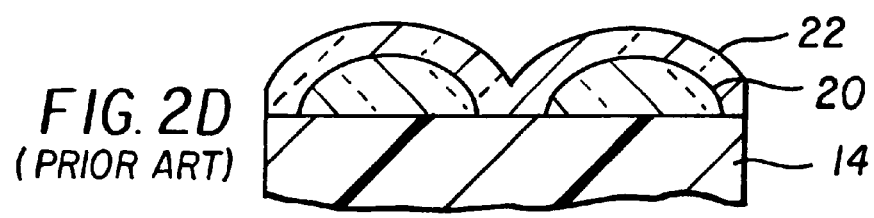
Figure 3A:
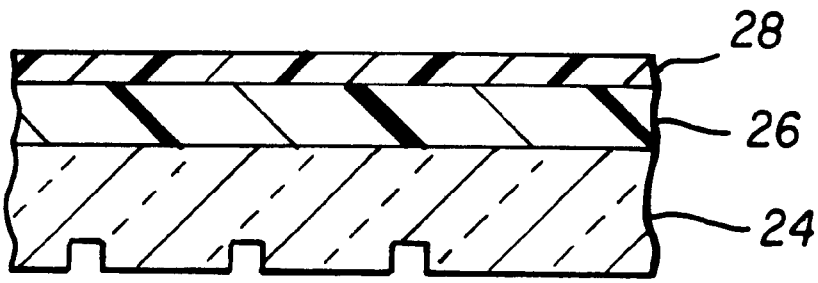
FIGS. 3A–E show a series of steps in yet another prior method for forming lenslets.
Figure 3B:
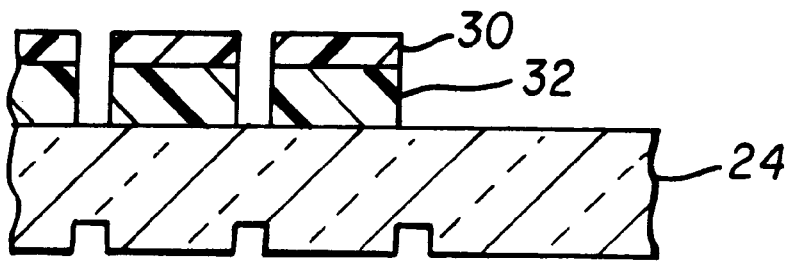
Figure 3C:
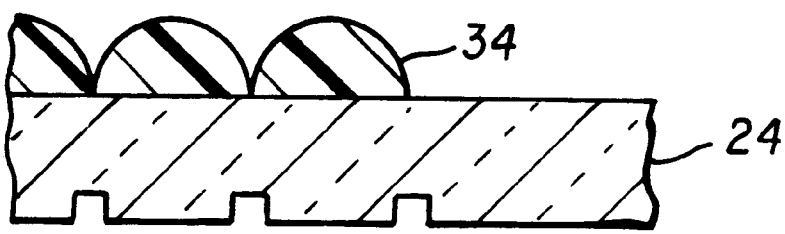
Figure 3D:
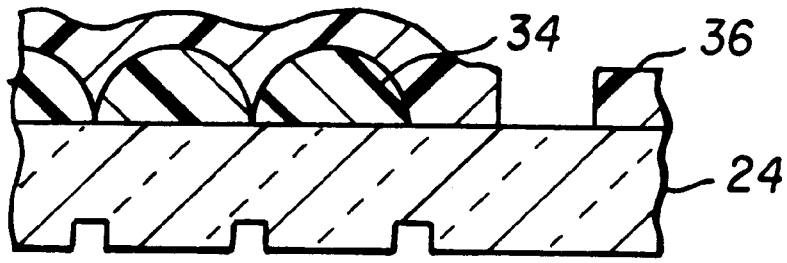
Figure 3E:
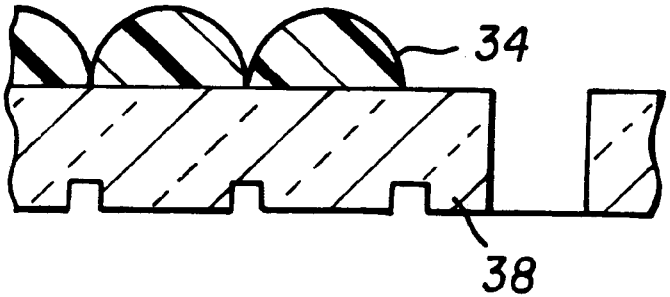
Figure 4A:
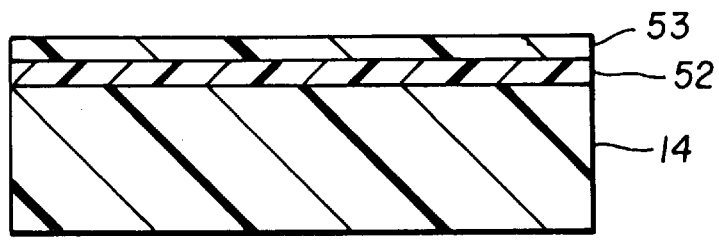
FIGS. 4A–I show a series of steps for forming lenslets in accordance with the present invention.

The important aspects of the present invention are illustrated in FIGS. 4A–I. With reference to FIG. 4A an organic spacer layer 14 is deposited such as by spin coating on the substrate or on layer(s) on the substrate. (Note that the substrate is not shown; only subsequent layers on it). Next a first thin inorganic etch-stop layer 52 is deposited on the organic spacer layer 14, followed by the deposition of a first thin photosensitive resin layer 53. The first thin inorganic etch-stop layer 52 can be deposited by RF sputtering, thermal evaporation, plasma enhanced chemical vapor deposition, or spin on glass techniques. The first thin inorganic etch-stop layer 52 is material selected from the group consisting of silicon dioxide, silicon nitride, silicon, germanium, titanium, and organometallic glasses.

Figure 4B:
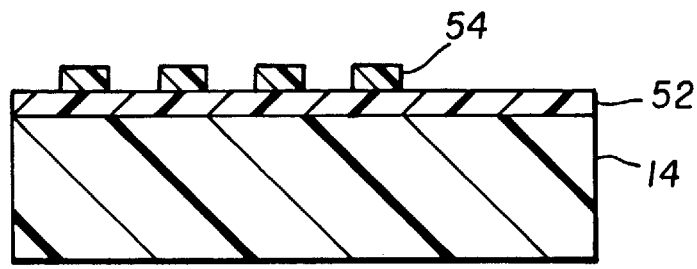
Figure 4C:
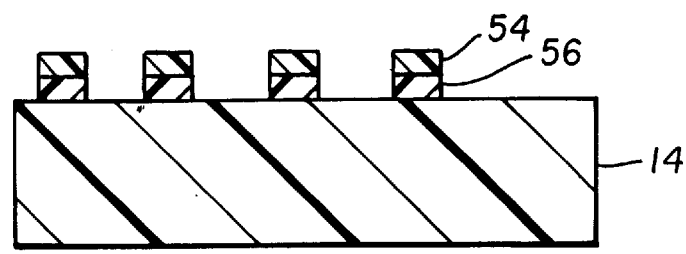
Figure 4D:
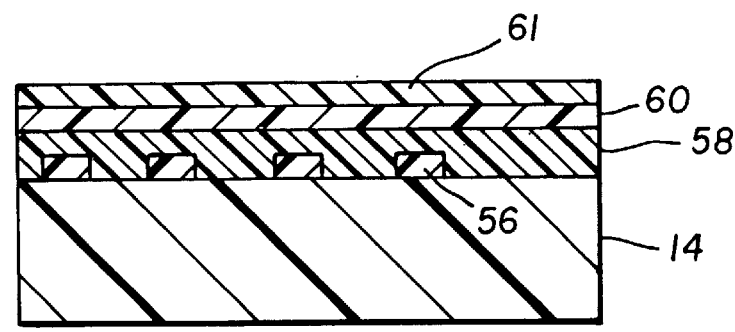
Figure 4E:
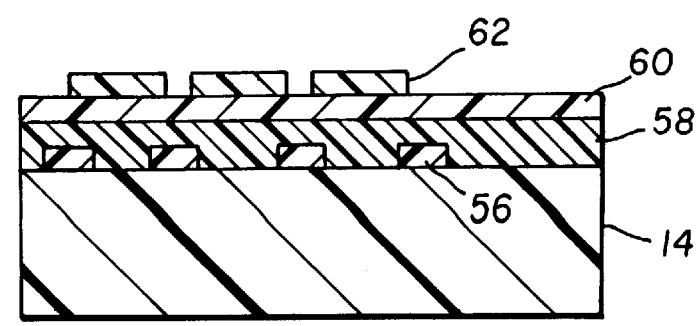

The first thin photosensitive resin layer 53 in FIG. 4A is photolithographically patterned according to a first photomask to form the first thin photosensitive resin mask 54 in FIG. 4B. The first thin photosensitive resin mask 54 defines the lateral boundaries of the organic spacer pads 68 (see FIG. 4H) and in doing so defines access to the desired areas on the substrate. The first thin photosensitive resin mask 54 also defines an array of open regions corresponding to the lenslet array to be formed such that the area of each open region is less than or equal to the area of the footprint of the corresponding lenslet to be formed, where the term footprint defines the area of the base of the lenslet. The pattern of the resulting first thin photosensitive resin mask 54 is then transferred to the first thin inorganic etch-stop layer 52 by means of wet or dry etch techniques to form first thin inorganic etch-stop mask 56 (FIG. 4C). The first thin photosensitive resin mask 54 is then removed using standard photosensitive resin removal techniques, while leaving the organic spacer layer 14 intact. Organic transparent lenslet-forming layer 58 is then coated on first thin inorganic etch-stop mask 56 and organic spacer layer 14. A second thin inorganic etch-stop layer 60 is deposited on this organic transparent lenslet-forming layer 58. The second thin organic etch-stop layer 60 can be deposited by RF sputtering, thermal evaporation, plasma enhanced chemical vapor deposition, or spin on glass techniques. Finally, a second thin photosensitive resin layer 61 is coated on the second thin inorganic etch-stop layer 60 (see FIG. 4D). After photolithographic patterning, the second thin photosensitive resin layer 61 becomes a second thin photosensitive resin mask 62, whose pattern corresponds to the footprints of the individual lenslets to be formed. This second thin photosensitive resin mask 62 is positioned such that the lenslet array defined by the second mask pattern is precisely aligned with respect to the array of open regions of the first thin inorganic etch-stop mask pattern in the underlying first thin inorganic etch-stop mask 56 (FIG. 4E).

Figure 4F:
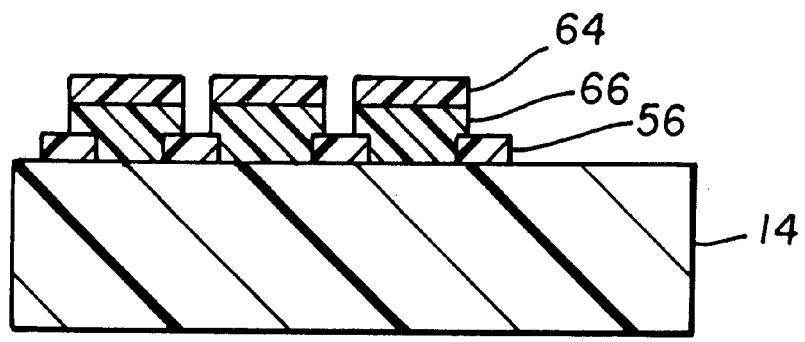
Figure 4G:
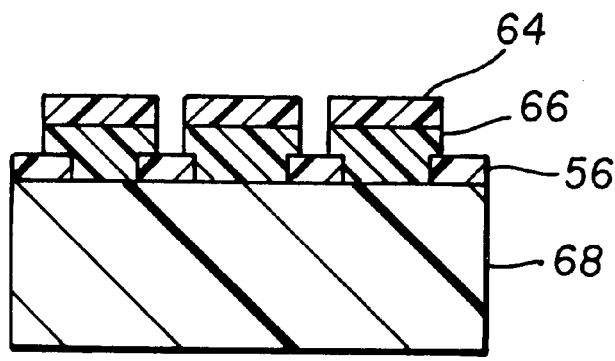
Figure 4H:
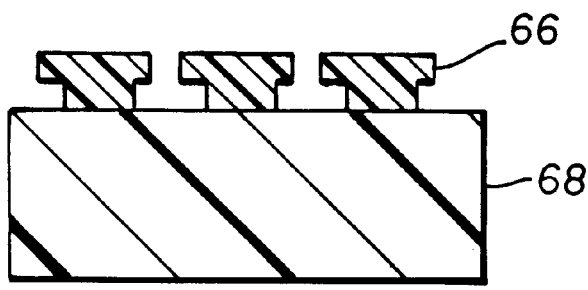
Figure 4I:
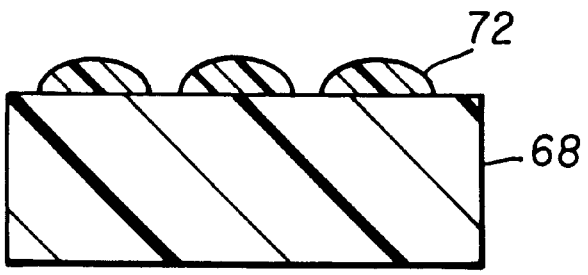

The second thin photosensitive resin mask 62 is transferred to second thin inorganic etch-stop layer 60 by means of wet or dry etch techniques to transfer or form a second thin inorganic etch-stop mask 64 as shown in FIG. 4F. This pattern in turn is transferred to the organic transparent lenslet-forming layer 58 by means of anisotropic oxygen plasma RIE. The duration of this anisotropic oxygen plasma etch is such that both the organic transparent lenslet precursor 66 and organic spacer pad 68 are formed (FIG. 4G). It will be appreciated that the organic spacer layer 14 can be separately etched. In either case the organic spacer layer 14 is etched according to the first thin inorganic etch-stop mask 56 pattern. It will be appreciated that the first thin inorganic etch-stop mask 56 prevents erosion of the organic spacer pad 68 in the regions between the organic transparent lenslet precursors 66 and, at the same time serves as a mask to define by anisotropically plasma etching the lateral limits of the organic spacer pad 68. A wet or dry isotropic etch process is used to remove both inorganic etch-stop masks 56 and 64 as shown in FIG. 4H. Finally the organic transparent lenslet precursors 66 are thermally reflowed to form the organic transparent lenslets 72 shown in FIG. 4I. The $T_g$ of the organic spacer pad 68 is chosen to be higher than that of he organic transparent lenslet-forming material. In this way, the organic spacer pad 68 retains its shape during heating and reflowing of the organic transparent lenslet precursors 66. As mentioned previously, the thickness uniformity of the organic transparent lenslet-forming layer 58 is maintained since the organic spacer layer 14 is patterned subsequent to the deposition of this organic transparent lenslet-forming layer 58. Furthermore the thickness uniformity of the organic spacer pad 68 is maintained due to the presence of the first thin inorganic etch-stop mask 56. Finally, the thermal reflow process will result in the complete filling in of voids created at the base of the lenslets by the removal of the first thin etch-stop mask (see FIGS. 4G and 4H).

As mentioned previously, it is understood that organic spacer layer 14 could be deposited on layer(s) that have been formed on the silicon wafer substrate. The organic transparent lenslet-forming layer 58 can be any transparent polymer or other thermoplastic resin. The only constraints on the organic material chosen for this layer are that 1) it should maintain optical transparency under ambient conditions, i.e., it should not discolor due to oxidation or any other mechanisms, 2) it should have a sufficiently high index of refraction, 3) it should exhibit a glass softening temperature $T_g$ such that it will reflow at temperatures high enough to exceed the highest subsequent wafer process temperature and low enough that existing organic structures and solid-state imager elements will not be damaged, and 4) it should be free from metallic elements that form impervious oxides during oxygen plasma etching. Typical candidates for the organic transparent lenslet-forming layer 58 could be any one of a number of organic materials such as polyacrylates or methacrylates, polycarbonates, polyesters, polyolefins, polystyrenes, polyimides, polyurethanes, polyethers, polyamides, polysulphones, or even evaporated or spun-on organic glasses.

It will be appreciated by those skilled in the art that some of the processing steps outlined in the above embodiment may be altered without affecting the outcome of the desired lenslet array. For example, the second thin inorganic etch-stop layer 60 and the second thin photosensitive resin layer 64 can be replaced by a single, thin metal-containing photosensitive resin material. Such a metal-containing photosensitive resin material would serve the purpose of these two layers, since such a material is photopatternable like the thin photosensitive resin material, and also is resistant to an oxygen plasma etch, once it has been photolithographically patterned.

It will also be appreciated by those skilled in the art that the trilayer RIE-PCM processing procedures outlined above in the embodiment of the invention could be replaced by trilayer Deep-UV PCM procedures. In this case, the inorganic thin film etch-stop layer would be replaced by a thin film of a material that is deep-UV blocking such as germanium-selenium or silicon. Furthermore the lenslet-forming layer would need to be deep-UV sensitive.

Several advantages of the present invention will be appreciated. In accordance with the present invention, highly transparent microlenses can be formed in a closely packed array such that light incident on said array can be efficiently collected and focused onto the solid-state imager photodetector array. Moreover, the present invention allows sufficient flexibility in the choice of materials that constitute the lenslet array. First, the optical and physical properties of the lenslet-forming material can be selected independently of the properties of the photosensitive pattern-forming layer. Because of this flexibility, it is possible to select the lenslet-forming material in such a way as to optimize the performance of the imager. For example, the index of refraction can be selected which gives rise to optimum light collection efficiency. The $T_g$ (glass transition temperature) can also be chosen such that subsequent thermal steps or applications involving heating to elevated temperatures would not degrade lenslet shape or performance. Furthermore, the present invention specifically provides a way whereby the organic spacer layer 14 is patterned after the organic transparent lenslet-forming layer 58 is coated thereby eliminating the problem of non-uniformity of the lenslet producing layer, and the resulting lenslet array.

Furthermore, the time required to sputter deposit thin inorganic etch-stop layers is very brief which reduces the manufacturing costs relative to the above-mentioned patents which require deposition of thick inorganic layers. In addition, the brief deposition time of thin inorganic etch-stop layers means that substrate heating is limited, which avoids potential damage to the substrate due to overheating. Furthermore, thin layers of inorganic materials deposited on organic bases tend to be more stable mechanically than thick inorganic layers deposited on organic bases. Finally, thin etch-stop layers are easier to remove after oxygen plasma RIE (reactive ion etching) than thicker layers of similar materials are.

As mentioned previously, it is preferable that thin photosensitive resin and thin etch-stop layers are used in the present invention. The photosensitive resin is used only as an intermediate masking layer for the thin etch-stop layer. The etch-stop layer can be thin owing to its high degree of resistance to the oxygen plasma etch. This means that the thin photosensitive resin and the thin etch-stop layers can be patterned with much higher resolution than would be possible with thicker layers. Replication of this resolution in the transparent organic lenslet-forming layer is made possible by virtue of the anisotropy of the oxygen plasma etch. Consequently the lenslets can be formed much closer together than would be otherwise possible. It will be appreciated that this is achieved without the need for overcoating with additional thick inorganic layers as in the case of the prior art due to Hokari.

Automatic removal of the thin photosensitive resin layer during an oxygen plasma etching process, which transfers the patterned second etch-stop structure to the organic transparent lenslet-forming layer 58, illustrates another advantage of the present invention. Thus the need to employ resin removal solvents which dissolve away the lenslet layer etch mask is eliminated. This is a clear advantage over the previously cited prior art to Kawashima.

It will be appreciated that the present invention additionally avoids the problem of nonuniform lenslet thickness and as a result eliminates some of the difficulties associated with the previously referenced prior art of Uchiyama and Tatewaki. It has the advantage that the thickness uniformity of the organic spacer pad 68 (see FIG. 4H) is precisely defined by the presence of the patterned first thin inorganic etch-stop mask 56.

Trilayer reactive ion etching-portable conformable mask (RIE-PCM) systems have been known for some time in the IC industry as a way of forming structures with high aspect ratios in organic planarizing layers. J. M. Moran and D. J. Maydan, "High Resolution, Steep Porfile Resist Patterns", (Journal of Vacuum Science Technology, 1979, 16, pp 1620–1624) were the first to demonstrate the versatility and process compatibility of trilayer $SiO_2$ RIE-PCM. Such a process has generally not been used for making lenslets which collect light and focuses the light onto photosensitive elements of a solid state imager.

Finally, it will be further appreciated that the present invention solves a problem associated with commonly-assigned U.S. Pat. No. 5,605,783 of Revelli et al. U.S. Pat. No. 5,605,783 describes a lenslet fabrication process which results in a residual portion of the etch-stop mask being left in the region directly beneath the lenslets (See FIG. 5G of U.S. Pat. No. 5,605,783). It is believed that the presence of residual etch-stop material beneath the lenslets could result in weaker bonding of the lenslets to the planarization layer and ultimately result in adhesion failures. In the present invention, the first thin inorganic etch-stop mask 56 provides two functions. First it defines openings in the planarization layer to provide access to the electrical contacts between the individual die on the device wafer. Secondly it provides openings in the regions directly beneath the lenslets (see FIG. 4G). This second feature of first thin inorganic etch stop mask 56 permits complete removal of the mask prior to lenslet formation and results in none of the first thin inorganic etch-stop mask 56 remaining in the regions directly beneath the lenslets (see FIG. 4I). Therefore the lenslets fabricated according to the present invention should adhere to the substrate more securely than those of the aforementioned prior art.

The invention has been described in detail with particular reference to certain preferred embodiments thereof, but it will be understood that variations and modifications can be effected within the spirit and scope of the invention.

PARTS LIST 12 lenslet precursor structures
14 organic spacer layer
16 lenslet
18 inorganic transparent lenslet-forming layer
20 inorganic transparent lenslet
22 inorganic lenslet covering film
24 inorganic planarization/spacer layer
26 organic transparent lenslet-forming layer
28 first photosensitive resin layer
30 first photosensitive resin etch-mask
32 organic transparent lenslet precursor
34 organic transparent lenslet
36 second photosensitive resin etch-mask
38 inorganic spacer pad
52 first thin inorganic etch-stop layer
53 first thin photosensitive resin layer
54 first thin photosensitive resin mask
56 first thin inorganic etch-stop mask
58 organic transparent lenslet-forming layer
60 second thin inorganic etch-stop layer
61 second thin photosensitive resin layer
62 second thin photosensitive resin mask
64 second thin inorganic etch-stop mask
66 organic transparent lenslet precursor
68 organic spacer pad
72 organic transparent lenslet

What is claimed is:

1. A method for forming lenslets which collect light and focuses the light onto photosensitive elements of a solid-state imager, comprising the steps of:

(a) providing a first etch-stop layer on a spacer layer formed on a substrate or layer(s) on a substrate;

(b) providing a first photosensitive resin layer on the first etch-stop layer and patterning the first photosensitive resin layer to form a first mask pattern wherein the first mask pattern defines an array of open regions corresponding to the lenslet array to be formed such that the area of each open region is less than and covered by the area of the footprint of the corresponding lenslet and wherein the first mask pattern also defines the areas of the spacer layer which are to be removed;

(c) performing an etch transfer of the first mask pattern of the first photosensitive resin layer to the first etch-stop layer to form a first etch-stop mask pattern in the first etch-stop layer, and removing the first photosensitive resin layer;

(d) providing a transparent lenslet-forming layer over the spacer layer;

(e) forming a second etch-stop layer on the transparent lenslet-forming layer and patterning a second photosensitive resin layer on the second etch-stop layer to form a second photosensitive resin mask pattern wherein the second photosensitive resin mask pattern corresponds to the lenslet array to be formed and wherein the lenslet array defined by the second mask photosensitive resin pattern is aligned to the array of open regions of the first etch-stop layer;

(f) transferring by etching the pattern of the second photosensitive resin layer to the second etch-stop layer to form a second etch-stop mask pattern;

(g) anisotropically plasma etching the transparent lenslet-forming layer according to the second etch-stop mask pattern to form a transparent lenslet precursor;

(h) anisotropically plasma etching the spacer layer according to the first etch-stop mask pattern;

(i) isotropically etching to remove remaining portions of the first etch-stop layer forming the first etch-stop mask and portions of the second etch-stop layer forming the second etch-stop mask so that the remaining transparent lenslet precursor is undercut; and (j) thermally reflowing the patterned transparent lenslet precursor to form the lenslets directly on the spacer layer.

2. The method of claim 1 wherein the transparent lenslet-forming layer and the spacer layer both include organic materials and the first and second etch-stop layers include inorganic materials.

3. The method of claim 2 wherein the transparent lenslet-forming layer is an organic polymer selected from the group consisting of polyacrylates; polycarbonates; polyesters; polyolefins; polystyrenes; polyimides; polyurethanes; polyethers; polyamides; polysulphones; methacrylates; and evaporated and spun-on organic glasses.

4. The method of claim 1 wherein the transparent lenslet-forming layer and the spacer layer both include organic materials, the first etch-stop layer includes inorganic material, and the second etch-stop layer includes a metal-containing photosensitive resin.

5. The method of claim 1 wherein the first and second etch-stop layers are thin films and include materials selected from the group consisting of silicon dioxide, silicon nitride, silicon, germanium, titanium, and organometallic glasses.

6. The method of claim 5 wherein the first and second etch-stop layers are deposited by RF sputtering, thermal evaporation, plasma enhanced chemical vapor deposition, or spin on glass techniques.

* * * * *